(12) United States Patent
Yoon et al.

(10) Patent No.: US 7,615,486 B2
(45) Date of Patent: Nov. 10, 2009

(54) APPARATUS AND METHOD FOR INTEGRATED SURFACE TREATMENT AND DEPOSITION FOR COPPER INTERCONNECT

(75) Inventors: Hyungsuk Alexander Yoon, San Jose, CA (US); Mikhail Korolik, San Jose, CA (US); Fritz C. Redeker, Fremont, CA (US); John M. Boyd, Woodlawn (CA); Yezdi Dordi, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 42 days.

(21) Appl. No.: 11/736,522

(22) Filed: Apr. 17, 2007

(65) Prior Publication Data

US 2008/0260940 A1    Oct. 23, 2008

(51) Int. Cl.
*H01L 21/4763* (2006.01)
(52) U.S. Cl. .................. 438/640; 438/618; 438/637; 438/672; 257/E21.575; 257/E21.577; 257/E21.585
(58) Field of Classification Search .................. 438/645
See application file for complete search history.

(56) References Cited

U.S. PATENT DOCUMENTS

2005/0106865 A1* 5/2005 Chung et al. ................ 438/685
2005/0158473 A1* 7/2005 Raykin et al. ............... 427/299
2006/0033678 A1* 2/2006 Lubomirsky et al. .......... 345/32
2007/0020890 A1* 1/2007 Thakur et al. ............... 438/478

* cited by examiner

*Primary Examiner*—Savitri Mulpuri
*Assistant Examiner*—Cheung Lee
(74) *Attorney, Agent, or Firm*—Martine Penilla & Gencarella, LLP.

(57) ABSTRACT

A method and system for depositing films on a substrate for copper interconnect in an integrated system are provided to enable controlled-ambient transitions within an integrated system to limit exposure of the substrate to uncontrolled ambient conditions. The method includes moving the substrate into a processing chamber having a plurality of proximity heads. Within the processing chamber, barrier layer deposition is performed over a surface of the substrate using one of the plurality of proximity heads functioning to perform barrier layer ALD. In addition, the method includes moving the substrate from the processing chamber, through a transfer module of the integrated systems, into a processing module for performing copper seed layer deposition. Within the processing module for performing copper seed layer deposition, copper seed layer deposition is performed over the surface of the substrate. The processing chamber for performing the barrier layer ALD and the processing module for performing the copper seed layer deposition are parts of the integrated system.

22 Claims, 8 Drawing Sheets

APPARATUS AND METHOD FOR INTEGRATED SURFACE TREATMENT AND DEPOSITION FOR COPPER INTERCONNECT

CLAIM OF PRIORITY

This application claims priority under 35 U.S.C. § 120 of U.S. application Ser. No. 11/514,038, entitled "Processes and Systems for Engineering a Barrier Surface for Copper Deposition" filed on Aug. 30, 2006, which is herein incorporated by reference.

CROSS REFERENCE TO RELATED APPLICATION

This application is related to U.S. patent application Ser. No. 11/736,514, entitled "Apparatus and Method for Pre and Post Treatment of Atomic Layer Deposition," U.S. patent application Ser. No. 11/736,511, entitled "Apparatus and Method for Atomic Layer Deposition," and U.S. patent application Ser. No. 11/736,519, entitled "Apparatus and Method for Integrated Surface Treatment and Film Deposition," all of which are filed on the same day as the instant application. The disclosure of these related applications is incorporated herein by reference in their entireties for all purposes.

BACKGROUND

In the fabrication of semiconductor devices such as integrated circuits, memory cells, and the like, a series of manufacturing operations are performed to define features on semiconductor wafers. The semiconductor wafers include integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

Reliably producing sub-micron and smaller features is one of the key technologies for the next generation of very large scale integration (VLSI) and ultra large scale integration (ULSI) of semiconductor devices. However, the shrinking dimensions of interconnect in VLSI and ULSI technologies have placed additional demands on the processing capabilities. As circuit densities increase, the widths of vias, contacts and other features, as well as the dielectric materials between them, decrease to sub-micron dimensions (e.g., less than 0.20 micrometers or less), whereas the thickness of the dielectric layers remains substantially constant, with the result that the aspect ratios for the features, i.e., their height divided by width, increase. Many traditional deposition processes have difficulty achieving substantially void-free and seam-free filling of sub-micron structures where the aspect ratio exceeds 4:1.

Currently, copper and its alloys have become the metals of choice for sub-micron interconnect technology due to its lower resistivity. One problem with the use of copper is that copper diffuses into silicon, silicon dioxide, and other dielectric materials, which may compromise the integrity of devices. Therefore, conformal barrier layers become increasingly important to prevent copper diffusion. Copper might not adhere well to the barrier layer; therefore, a liner layer might need to be deposited between the barrier layer and copper. Conformal deposition of the liner layer is also important to provide good step coverage to assist copper adhesion and/or deposition.

Conformal deposition of the barrier layer on interconnect features by deposition methods, such as atomic layer deposition (ALD), needs to occur on clean surfaces to ensure good adhesion between the barrier layer and/or liner layer, and the material(s) the barrier layer deposited upon. Surface impurity can become a source of defects during the heating cycles of the substrate processing. Pre-treatment can be used to remove unwanted compounds from the substrate surface prior to barrier deposition. In addition, deposition by ALD might need surface pre-treatment to make the substrate surface easier to bond with the deposition precursor to improve the quality of barrier layer deposition.

Electro-migration (EM) is a well-known reliability problem for metal interconnects, caused by electrons pushing and moving metal atoms in the direction of current flow at a rate determined by the current density. EM in copper lines is a surface phenomenon. It can occur wherever the copper is free to move, typically at an interface where there is poor adhesion between the copper and another material, such as at the copper/barrier or copper/liner interface. The quality and conformality of the barrier layer and/or liner layer can certainly affect the EM performance of copper interconnect. It is desirable to perform the ALD barrier and liner layer deposition right after the surface pre-treatment, since the pre-treated surface might be altered if the surface is exposed to oxygen or other contaminants for a period of time.

A post-treatment after barrier and/or liner layer deposition prior to the deposition of copper can improve the adhesion between the barrier or liner layer with copper by removing impurities from the substrate surface. In addition, a post-treatment after barrier or liner layer deposition prior the deposition of a copper seed layer by electroless method can increase nucleation sites for copper seed layer deposition, which can improve the film quality of the copper seed layer.

In view of the foregoing, there is a need for integrated systems and methods that perform substrate surface treatment and film deposition for copper interconnect with improved metal migration performance and reduced void propagation.

SUMMARY

Broadly speaking, the embodiments fill the needs for integrated systems and methods that perform substrate surface treatment and film deposition for copper interconnect with improved metal migration performance and reduced void propagation. It should be appreciated that the present invention can be implemented in numerous ways, including as a solution, a method, a process, an apparatus, or a system. Several inventive embodiments of the present invention are described below.

In one embodiment, a method of depositing films on a substrate for copper interconnect in an integrated system is provided. The method includes moving the substrate into a processing chamber having a plurality of proximity heads. Selected ones of the proximity heads is configured to perform at least one of surface treatments and atomic layer depositions (ALDs). The processing chamber is part of the integrated system. Within the processing chamber, barrier layer deposition is performed over a surface of the substrate using one of the plurality of proximity heads functioning to perform barrier layer ALD. In addition, the method includes moving the substrate from the processing chamber, through a transfer module of the integrated system and into a processing module for performing copper seed layer deposition. The processing module for performing copper seed layer deposition is part of the integrated system. Within the processing module for performing copper seed layer deposition, copper seed layer deposition is performed over the surface of the substrate. The integrated system enables controlled-ambient transitions within the integrated system to limit exposure of the substrate to uncontrolled ambient conditions outside of the integrated system.

In another embodiment, an integrated system for depositing films on a substrate for copper interconnect is provided. The integrated system includes a processing chamber having a plurality of proximity heads. Selected ones of the proximity heads are used for surface treatments and atomic layer depositions (ALDs). The integrated system also includes a vacuum transfer module coupled to the processing chamber. The vacuum transfer module is used to transfer the substrate in the integrated system. The integrated system further includes a processing module for copper seed layer deposition. In addition, the integrated system includes controlled-ambient transfer module coupled to the processing module for copper seed layer deposition. Additionally, the integrated system includes a loadlock coupled to the vacuum transfer module and to the controlled-ambient transfer module. The loadlock is used to assist transferring the substrate between the vacuum transfer module and to the controlled-ambient transfer module. The integrated system enables controlled-ambient transitions within the integrated system to limit exposure of the substrate to uncontrolled ambient conditions outside of the integrated system.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE EXEMPLARY EMBODIMENTS

Several exemplary embodiments of integrated apparatus (or systems) and methods for substrate surface treatment and film deposition for copper interconnect are detailed. Substrate pre-treatment prior to barrier layer deposition can either remove surface contaminants or can activate surface for barrier layer atomic layer deposition (ALD). Substrate post-treatment after film deposition can either remove surface contaminants or prepare the substrate surface for deposition of another film, such as a copper seed layer. Pre-treatment and post-treatment proximity heads can be integrated with an atomic layer deposition (ALD) proximity head to complete the film deposition and surface treatment in one chamber. Afterwards, the substrate can be moved into a copper seed layer deposition chamber in the same integrated system for copper seed layer deposition. The substrate is either transferred under vacuum or in a controlled ambient to limit the exposure to oxygen or other contaminants. ALD barrier layer, ALD liner layer, and copper seed layer deposited on clean or activated surfaces yield good electro-migration (EM) performance, and avoid delamination and void propagation.

It should be appreciated that the present invention can be implemented in numerous ways, including a process, a method, an apparatus, or a system. Several inventive embodiments of the present invention are described below. It will be apparent to those skilled in the art that the present invention may be practiced without some or all of the specific details set forth herein.

Figure 1A:
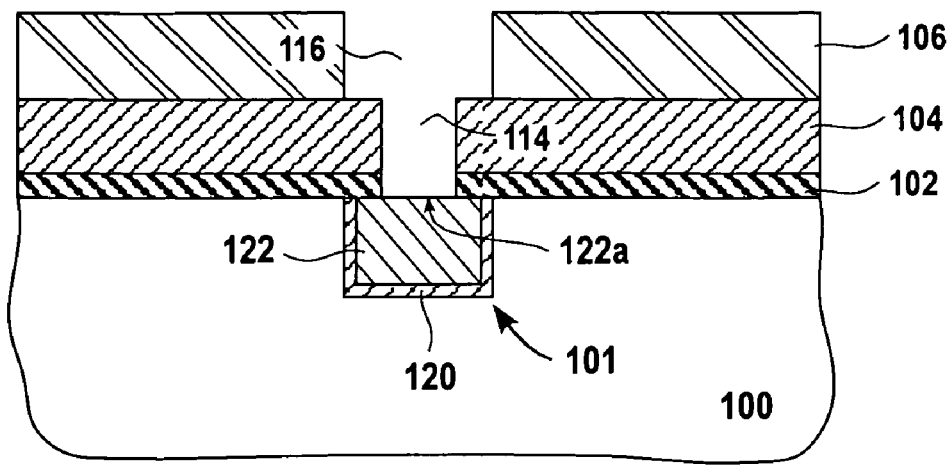
FIG. 1A show an exemplary cross section of an interconnect structure prior to barrier layer deposition, in accordance of an embodiment of the current invention.

FIG. 1A shows an exemplary cross-section of an interconnect structure(s) after being patterned by using a dual damascene process sequence. The interconnect structure(s) is on a substrate 50 and has a dielectric layer 100, which was previously fabricated to form a metallization line 101 therein. The metallization line is typically fabricated by etching a trench into the dielectric 100 and then filling the trench with a conductive material, such as copper.

In the trench, there is a barrier layer 120, used to prevent the copper material 122, from diffusing into the dielectric 100. The barrier layer 120 can be made of PVD tantalum nitride (TaN), PVD tantalum (Ta), ALD TaN, or a combination of these films. Other barrier layer materials can also be used. Alternatively, a liner layer can be deposited between the barrier layer 120 and the copper material 122 to increase the adhesion between the copper material 122 and the barrier layer 120. Another barrier layer 102 is deposited over the planarized copper material 122 to protect the copper material 122 from premature oxidation when via holes 114 are etched through overlying dielectric materials 104, 106 to the barrier layer 102. The barrier layer 102 is also configured to function as a selective etch stop and a copper diffusion barrier. Exemplary barrier layer 102 materials include silicon nitride (SiN) or silicon carbide (SiC).

A via dielectric layer 104 is deposited over the barrier layer 102. The via dielectric layer 104 can be made of a material with a low dielectric constant. Over the via dielectric layer 104 is a trench dielectric layer 106. The trench dielectric layer 106 may be a low K dielectric material, which can be a material same as or different from layer 104. In one embodiment, both the via and trench dielectric layers are made of the same material, and deposited at the same time to form a continuous film. After the trench dielectric layer 106 is deposited, the substrate 50 that holds the structure(s) undergoes patterning and etching processes to form the via holes 114 and trenches 116 by known art.

Figure 1B:
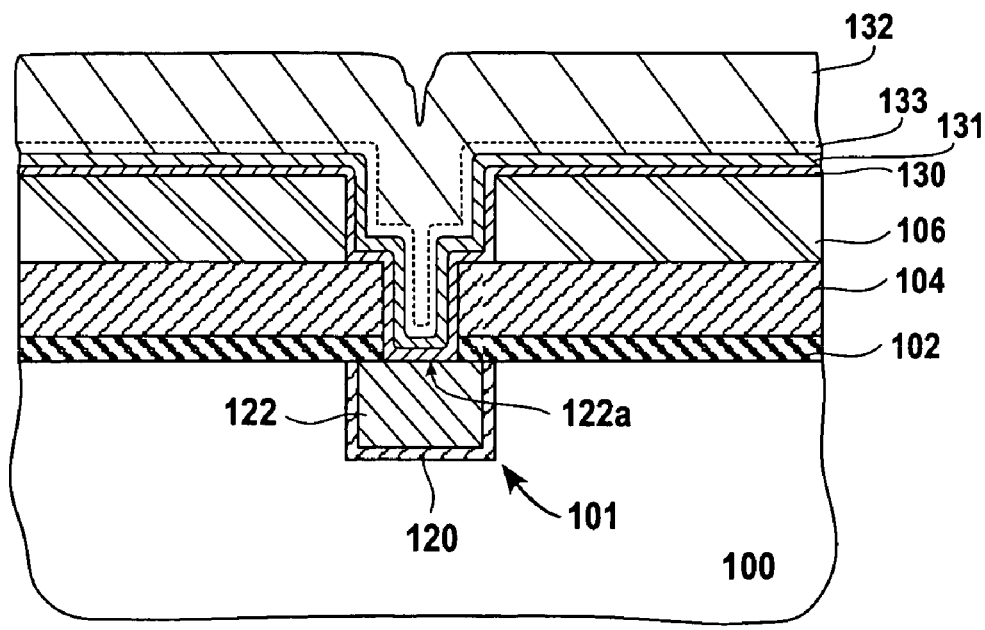
FIG. 1B show an exemplary cross section of an interconnect structure after deposition of barrier layer deposition and copper, in accordance of an embodiment of the current invention.

FIG. 1B shows that after the formation of via holes 114 and trenches 116, a barrier layer 130, an optional liner layer 131, and a copper layer 132 are deposited to line and fill the via holes 114 and the trenches 116. The barrier layer 130 can be made by materials, such as tantalum nitride (TaN), tantalum (Ta), Ruthenium (Ru), or a hybrid combination of these films. Barrier layer materials may be other refractory metal compound including but not limited to titanium (Ti), titanium nitride (TiN), tungsten (W), zirconium (Zr), hafnium (Hf), molybdenum (Mo), niobium (Nb), vanadium (V), and chromium (Cr), among others.

The optional liner layer 131 can be made by materials, such as tantalum (Ta), and Ruthenium (Ru). Liner layer materials may be other refractory metal compound including but not limited to titanium (Ti), titanium nitride (TiN), tungsten (W), zirconium (Zr), hafnium (Hf), molybdenum (Mo), niobium (Nb), vanadium (V), and chromium (Cr), among others. While these are the commonly considered materials, other barrier layer and liner layer materials can also be used. A copper layer 132 is then deposited to fill the via holes 114 and the trenches 116. A copper seed layer 133 can be deposited prior to the gap-filling copper film 132 is deposited.

As discussed above, before depositing a metallic barrier layer 130, the substrate surface can have residual contaminants left from etching the dielectric layers 104, 106 and the barrier layer 102 to allow the metallic barrier layer 130 to be in contact with the copper material 122. A cleaning process, such as Ar sputtering, can be used to remove surface contaminant. Also as discussed above, conformal deposition of metallic barrier layer 130 by ALD might need surface pre-treatment to make the substrate surface easier to bond with the deposition precursor. The reason is described below.

Figure 2:
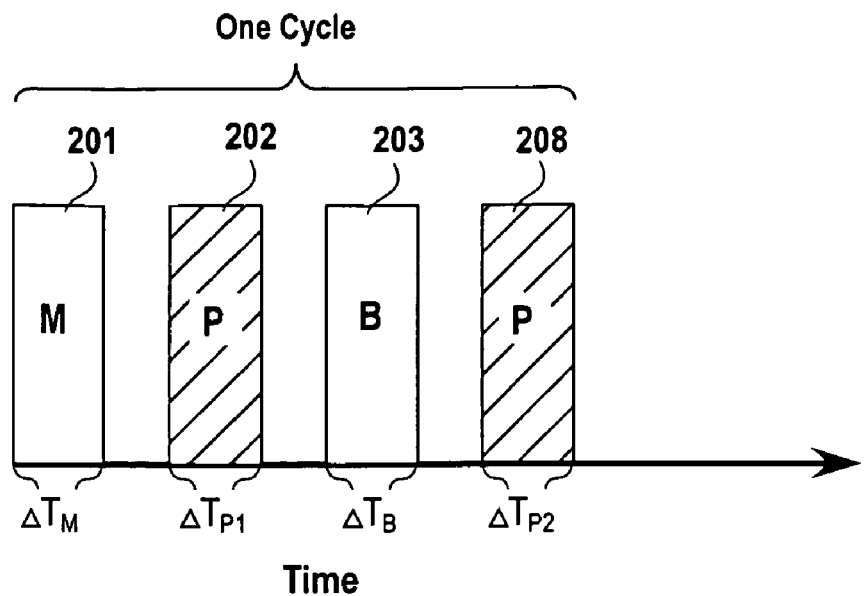
FIG. 2 shows an exemplary ALD deposition cycle.

Atomic layer deposition (ALD) is known to produce thin film with good step coverage. ALD is typically accomplished by using multiple pulses, such as two pulses, of reactants with gas purge in between, as shown in FIG. 2. For metallic barrier deposition, a pulse of barrier-metal-containing reactant (M) 201 is delivered to the substrate surface, followed by a pulse of purging gas (P) 202. The pulse of barrier-metal-containing reactant 201 delivered to the substrate surface to form a monolayer of barrier metal, such as Ta, on the substrate surface. In one embodiment, the pulse of purging gas is a plasma-enhanced (or plasma-assisted) gas. The barrier metal, such as Ta, bonds to the substrate surface, which can be made of a dielectric material, such as low-k materials 104, 106 of FIG. 1A, and/or a conductive material, such as copper material 122 of FIG. 1A. The purge gas 202 removes the excess barrier-metal-containing reactant 201 from the substrate surface.

Following the pulse of the purging gas 202, a pulse of reactant (B) 203 is delivered to the substrate surface. If the barrier material contains nitrogen, such as TaN, the reactant (B) 203 is likely to contain nitrogen. The reactant (B) 203 can be nitrogen-containing gas to form TaN with the Ta on the substrate. Examples of reactant (B) 203 include ammonia ($NH_3$), $N_2$, and NO. Other N-containing precursors gases may be used including but not limited to $N_xH_y$ for x and y integers (e.g., $N_2H_4$), $N_2$ plasma source, $NH_2N(CH_3)_2$, among others. If the barrier material contains little or no nitrogen, the reactant (B) 203 can be a hydrogen-containing reducing gas, such as $H_2$. $H_2$ is a reducing gas that reacts with the ligand bounding with the barrier-metal in reactant M 201 to terminate the film deposition. Following pulse 203 is a pulse of purging gas 204. Reactants M, B, and purge gas P can be plasma enhanced or thermally excited. In one embodiment, the pulse of reactant (B) 203 is a plasma-enhanced (or plasma-assisted).

Figure 3:
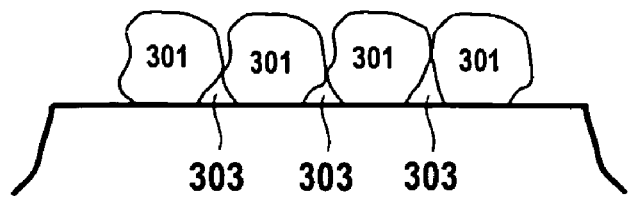
FIG. 3 shows a cross-sectional diagram of an ALD film grown with limited growth sites in the beginning of ALD deposition.

However, in some situations, the substrate surface does not possess ample bonding sites for all the potential locations on the surface. Accordingly, the barrier-metal-containing reactant M (or precursor) bonding to the surface can result in the formation of islands and grains which are sufficiently far apart to form poor quality ALD film. FIG. 3 shows an ALD film with islands 301 that are grown with limited growth sites in the beginning of ALD deposition. Between the islands 301, there are voids 303 along the surface of the substrate. Substrate surface, such as $SiO_2$ or low-k material, can be quite inert and not easy to bond with for barrier metal in the barrier-metal-containing reactant M. Surface treatment by OH, O, or O radical exposure can efficiently insert HOH into the SiOSi to generate 2 Si—OH surface species that are highly reactive with the barrier-metal-containing reactant M. The introduction of the pre-treatment plasma into the processing chamber containing the substrate can result in the formation of surface species at various desired bonding sites. In order to grow continuous interfaces and films, one embodiment of the present invention is to pre-treat the surface of the substrate prior to ALD in order to make the surface more susceptible to ALD, due to more deposition sites.

Due to the relatively long deposition cycle of conventional ALD process, the deposition rate (or throughput) for some barrier or liner layers, such as Ru, is considered too low from manufacturing standpoint. In order to improve the deposition rate, new systems and methods of using a proximity head for ALD of barrier layer and/or liner layer are invented. Details of using a proximity head to deposit an ALD film are described in commonly assigned U.S. patent application Ser. No. 11/736,511, entitled "Apparatus and Method for Atomic Layer Deposition," which is filed on the same day as the instant application. This application is incorporated herein by reference in its entirety. The ALD proximity head is briefly introduced below.

Figure 4A:
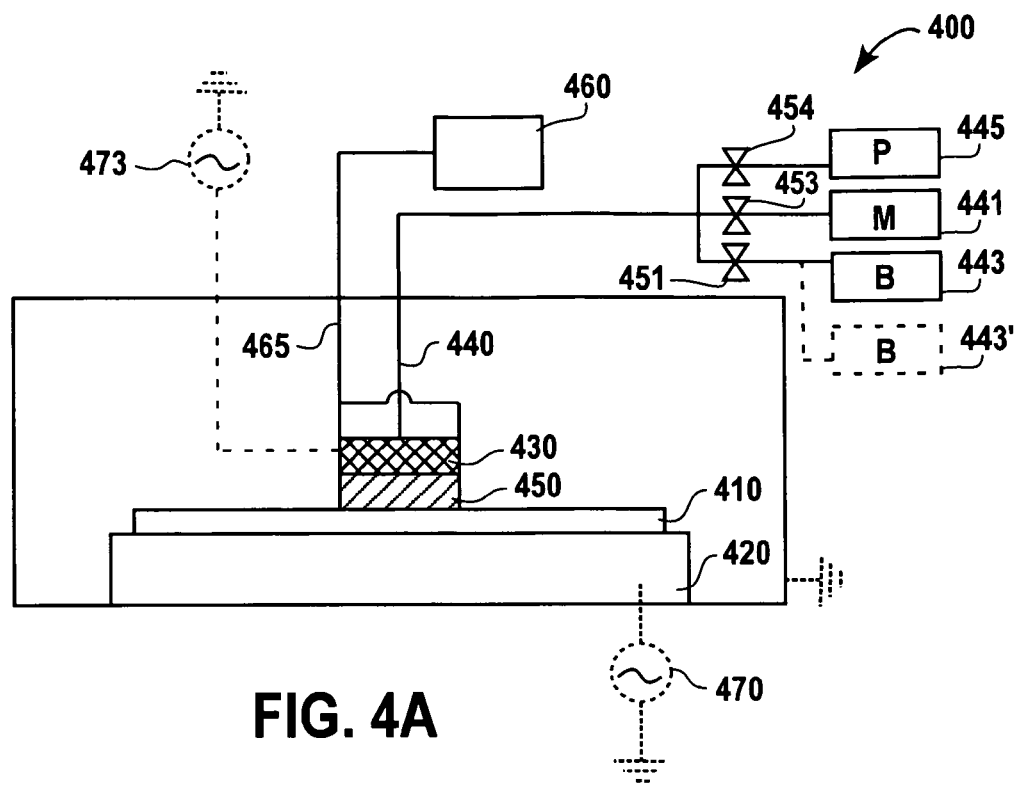
FIG. 4A shows a schematic diagram of a proximity head ALD chamber, in accordance with an embodiment of the current invention.

FIG. 4A shows a schematic diagram of an ALD reactor 400 with a proximity head 430. In reactor 400, there is a substrate 410 disposed on a substrate support 420. The proximity head 430 is supported above substrate 410 and covers only a portion of substrate surface. Between the proximity head 430 and the substrate 410, there is a reaction volume 450.

A gas inlet 440 and a vacuum line 465 are coupled to the proximity head 430. The gas inlet 440 supplies reactants and purging gas to process chamber 400. The gas inlet 440 can be coupled to a plurality of containers that store reactants and purging gas. The gas inlet 440 can be coupled to a container 441 that stores a first reactant, such as reactant M described in FIG. 2. The gas inlet 440 can also be coupled to a container 443 that supplies a second reactant, such as reactant B described in FIG. 2. As described above, reactant B can be plasma assisted. Reactant B can be supplied by a reactor 443' that generate plasmarized reactant B. Alternatively, the substrate support 420 can be coupled to a radio frequency (RF)

generator to generate a plasma of reactant B when reactant B is dispensed into the reaction volume 450, instead of supplying plasmarized reactant B from reactor 443'. Another alternative is to couple an RF generator 473 to the proximity head 430 to generate plasma. In one embodiment, one electrode is coupled to the RF generator and the other electrode is grounded, during plasma generation.

The gas inlet 440 is coupled to a container 445 that stores a purging gas. Reactant M, purging gas and reactant B can be diluted by a carrier gas, which can be an inert gas. During ALD deposition cycles, one of reactants M, B and purging gas P is supplied to the gas inlet 440. The on and off of gas supplies of these gas are controlled by valves 451, 453, and 454. The other end of the vacuum line 465 is a vacuum pump 460. The reaction volume 450 in FIG. 4a is much smaller than the reaction volume in a conventional ALD chamber. The deposition rate of proximity head ALD of barrier layer can be 10 times or higher than the deposition rate of conventional ALD.

Figure 4B:
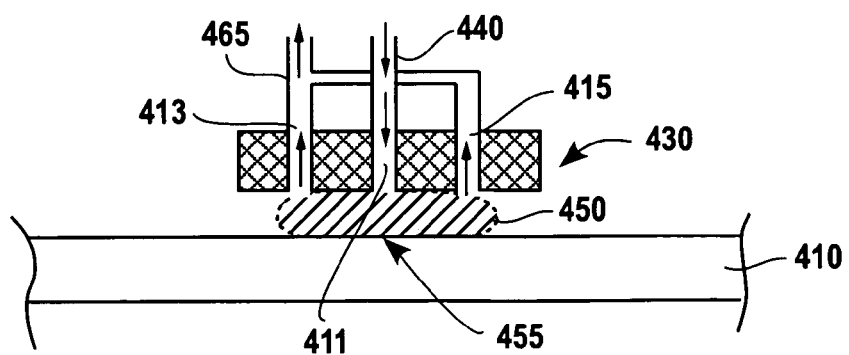
FIG. 4B shows a schematic diagram of a proximity head for ALD, in accordance with an embodiment of the current invention.

FIG. 4B shows one embodiment of a proximity head 430 disposed above substrate 410, with a reaction volume 450 between the proximity head 430 and substrate 410. The substrate surface under the reaction volume 450 is an active surface region 455. The proximity head 430 has one or more gas channels 411 that supplies reactant M, B, or purging gas P. On both sides of the gas channel 411, there are vacuum channels 413, 415 pumping excessive reactant M, B, purging gas, and/or reactant byproducts from the reaction volume 450. Reactant M, B, and purging gas P is passed through the gas channel 411 sequentially, such as the sequence shown in FIG. 2. Gas channel 411 is coupled to the gas inlet 440. When a pulse of gas, either reactant M, B, or purging gas P, is injected from the gas channel 411 to the substrate surface, the excess amount of gas is pumped away from the substrate surface by the vacuum channels 413, 415, which keeps the reaction volume small and reduces the purging or pumping time. Since the reaction volume is small, only small amount of reactant is needed to cover the small reaction volume. Similarly only small amount of purging gas is needed to purge the excess reactant from the reaction volume 450. In addition, the vacuum channels are right near the small reaction volume 450, which assists the pumping and purging of the excess reactants, purging gas, and reaction byproducts from the substrate surface. As a consequence, the pulse times $\Delta T_M$, $\Delta T_B$, $\Delta T_{P1}$, and $\Delta T_{P2}$ for reactants M, B, and purging gas P respectively, can be greatly reduced.

As a consequence, the ALD cycle time can be reduced and the throughput can be increased. Details of why ALD by proximity head has higher throughput than conventional ALD are discussed commonly assigned U.S. patent application Ser. No. 11/736,511, entitled "Apparatus and Method for Atomic Layer Deposition," which is mentioned above.

The proximity head for ALD can also have multiple sides with different sides dispensing different types of processing gases. Rotating the proximity head from side to side allows the ALD cycle to be completed and a thin film being deposited.

Figure 4C:
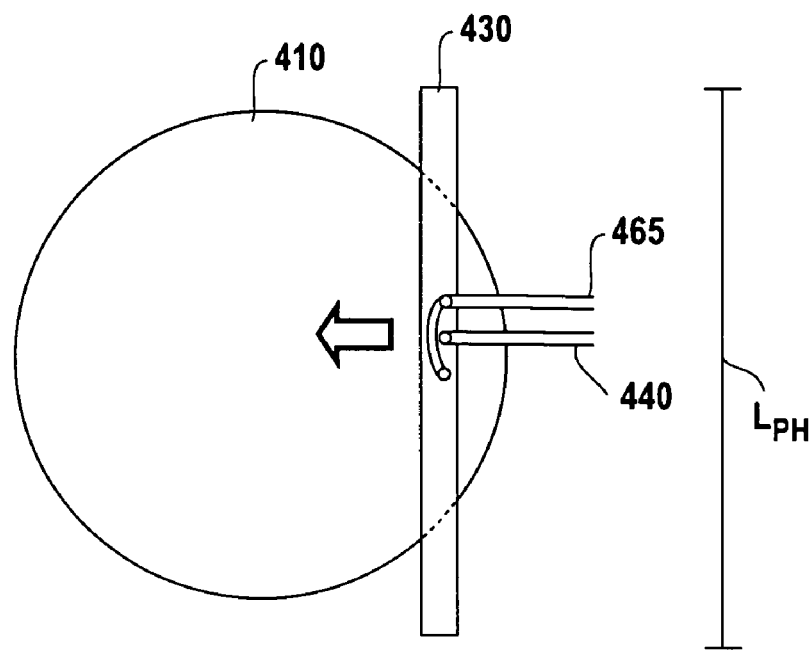
FIG. 4C shows a schematic diagram of a proximity head for ALD coupled to an RF power source over a substrate and a grounded substrate support, in accordance with an embodiment of the current invention.

FIG. 4C shows a schematic top view of an embodiment of proximity head 430 of FIGS. 4A and 4B on top of a substrate 410. Proximity head 430 moves across the substrate surface. In this embodiment, the length of the proximity head $L_{PH}$ is equal to or greater than the diameter of the substrate. The reaction volume under the proximity head covers the substrate surface underneath. By moving the proximity head across the substrate once, the entire substrate surface is deposited with a thin film of the barrier or liner layer. In another embodiment, the substrate 410 is moved under the proximity head 430. In yet another embodiment, both the proximity head 430 and the substrate 410 move, but in opposite directions to cross each other. The thickness of the thin film deposited can be controlled by the speed the proximity head 430 move across the substrate 410.

Figure 4D:
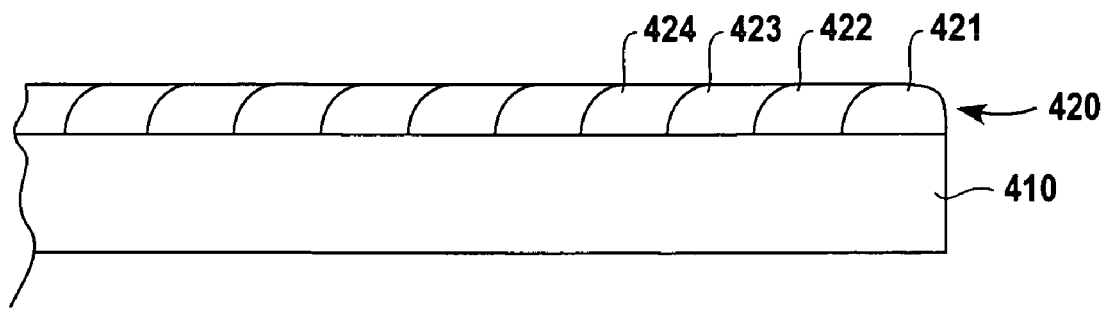
FIG. 4D shows a schematic diagram of a thin film deposited by proximity head ALD, in accordance with an embodiment of the current invention.

FIG. 4D shows a schematic cross-sectional diagram of a thin barrier or liner layer 420 deposited on a substrate 410, in accordance with one embodiment of the current invention. At the edge of substrate 410, a small section 421 of thin barrier or liner layer 420 is deposited under the proximity head. After section 421 is deposited, the proximity is moved towards left to deposit another section 422, which overlaps section 421 slightly. Section 423 follows section 422, and section 424 follows section 423, and so on. At the other edge of the substrate, the deposition process stops and a complete thin film 410 is formed.

As discussed above, in order to grow continuous interfaces and films, one embodiment of the present invention is to pre-treat the surface of the substrate prior to ALD in order to have the surface more susceptible to ALD. In addition, after barrier layer and/or liner layer is deposited on the substrate surface, the surface can be post-treated to remove any surface contaminant or to reduce impurities in the film, or to densify the film. Post-treatment can also enhance nucleation of copper seed layer deposited by an electroless process in a similar mechanism described above for pre-treatment prior to barrier layer deposition. Copper seed layer with enhanced nucleation has better film quality and results in better reliability (such as EM performance) and avoids delamination and void propagation. Surface pre-treatment and post-treatment can be performed by proximity heads. Details of using proximity heads for surface treatment are described in commonly assigned U.S. patent application Ser. No. 11/736,514, entitled "Apparatus and Method for Pre and Post Treatment of Atomic Layer Deposition," which is filed on the same day as the instant application. This application is incorporated herein by reference in its entirety. Surface treatment using proximity is briefly introduced below.

Figure 5A:
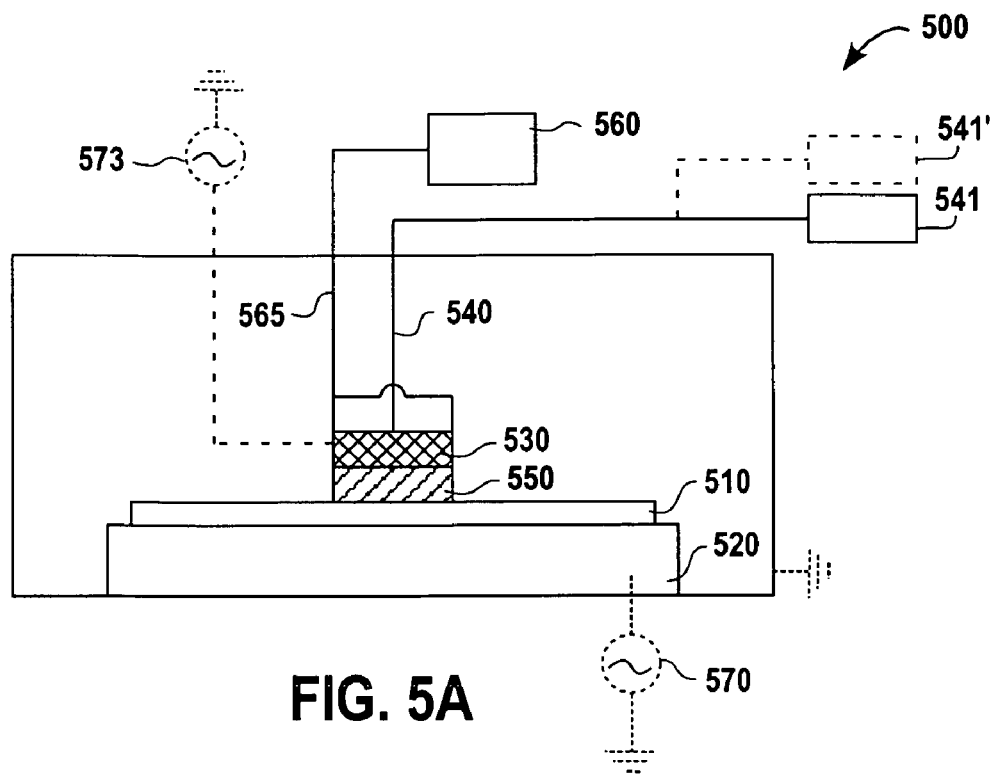
FIG. 5A shows a schematic diagram of a chamber with a surface treatment proximity head, in accordance with an embodiment of the current invention.

FIG. 5A shows a schematic diagram of a chamber 500 for substrate surface treatment with a proximity head 530. In chamber 500, there is a substrate 510 disposed on a substrate support 520. The proximity head 530 is supported above substrate 510. Between the proximity head 530 and the substrate 510, there is a reaction volume 550. Since the proximity head 530 only covers a portion of the substrate surface, the reaction volume 550 is much smaller than conventional surface treatment that applies to the entire substrate surface.

A gas inlet 540 and a vacuum line 565 are coupled to the proximity head 530. The other end of the vacuum line 565 is a pump 560. The gas inlet 540 supplies reactant gas to process chamber 500. The excess treatment gas is pumped away from the reaction volume 550 by the vacuum line 565. The gas inlet 540 can be coupled to a container 541 that stores a treatment gas, such as $H_2$. The treatment gas can be diluted with an inert gas. As described above, the treatment gas can be plasma assisted. In one embodiment, the plasmarized treatment gas is supplied by a reactor 541' that plasmarizes the treatment gas. Alternatively, the substrate support 520 can be coupled to a radio frequency (RF) generator 570 to generate plasma to plasmarize treatment gas when treatment gas is dispensed into the reaction volume 550, instead of supplying plasmarized treatment from reactor 541'. Another alternative is to couple an RF generator 573 to the proximity head 530 to generate plasma. The inert gas can be used to sustain chamber pressure or to sustain plasma.

Figure 5B:
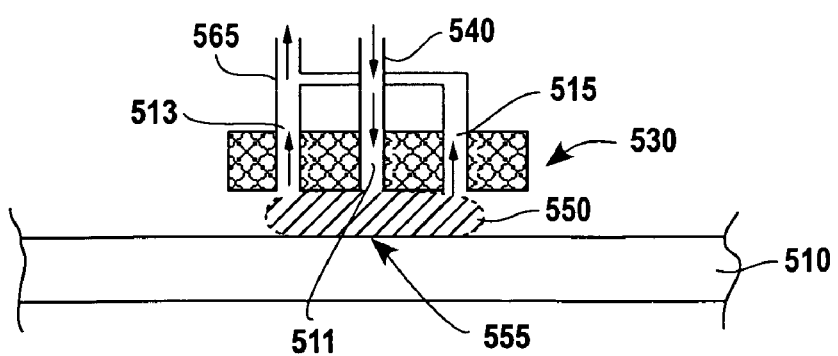
FIG. 5B shows a schematic diagram of a proximity head for surface treatment, in accordance with an embodiment of the current invention.

FIG. 5B shows one embodiment of a proximity head 530 disposed above substrate 510, with a reaction volume 450 between the proximity head 530 and substrate 510. The proximity head 530 has one or more gas channels 511 that supply treatment gas. On both sides of the gas channel 511, there are vacuum channels 513, 515 pumping excess treatment gas(es) from the reaction volume 550. Gas channel 511 is coupled the container of the treatment gas. When treatment gas is injected from the gas channel 511 to the substrate surface, the excess amount of gas is pumped away from the substrate surface by the vacuum channels 513, 515, which limits the reaction volume to be substantially below the proximity head 530.

The processing gases for ALD by proximity head and the treatment gas for surface treatment by proximity head can be plasma-enhanced or excited by other means, such as by thermal excitation, by UV, or by laser.

Figure 6A:
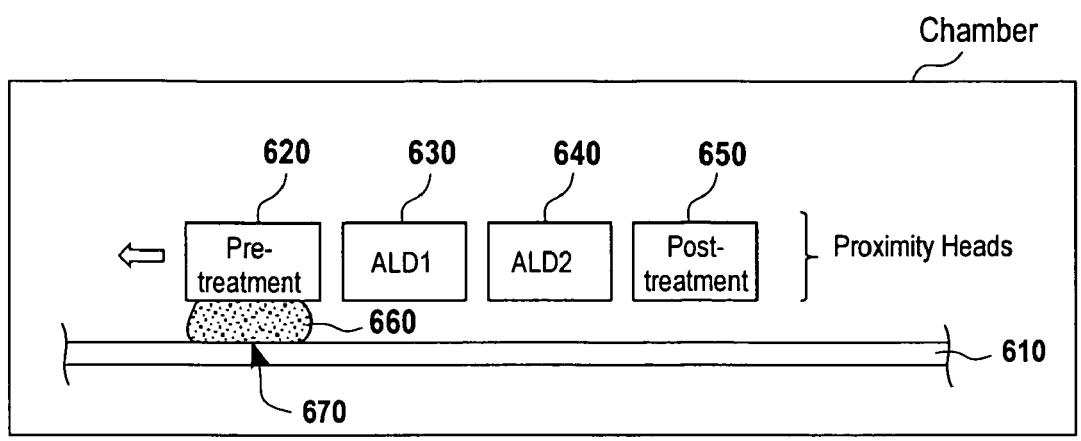
FIG. 6A shows plurality of proximity heads for surface treatment and deposition over a substrate, in accordance with an embodiment of the current invention.

ALD proximity head(s), pre-treatment proximity head(s), and/or post-treatment proximity head(s) can be integrated in one single process chamber to complete the deposition and treatment processes. In one embodiment, for a substrate to be deposited with a thin barrier layer, such as TaN, and a liner layer, such as Ru, the substrate can be pre-treated to clean the substrate surface or the substrate surface can be pre-treated to prepare the surface for barrier layer ALD deposition, as discussed above. After barrier layer deposition and liner layer deposition, the substrate surface can be posted-treated to prepare the surface for copper seed layer deposition. In a single and integrated deposition/treatment chamber, the substrate is pre-treated, deposited with a barrier layer and a liner layer, and post-treated. FIG. 6A shows a substrate 610 with a plurality of proximity treatment and deposition heads over the substrate 610. Pre-treatment proximity head 620 is used to pre-treat the substrate surface either to remove impurities or to prepare the substrate surface for ALD. Between the proximity head 620 and the surface of substrate 610, there is a reaction volume 660. The substrate surface below the reaction volume 660 is an active process region 670. Between the proximity head 620 and the surface of substrate 610, there is a reaction volume 660. The substrate surface below the reaction volume 660 is an active process region 670. Next to pre-treatment proximity head 620 is an ALD1 proximity head 630 used to deposit a barrier layer on the substrate. After the ALD1 proximity head 630 is an ALD2 proximity head 640 used to deposit a liner layer on the substrate. After the liner layer is deposited, the substrate is post-treated either to remove impurities or to prepare the substrate surface for copper seed layer deposition following. The post-treatment is performed by a post-treatment proximity head 650. The various proximity heads move sequentially across the substrate surface to complete treatment and deposition surface. The treatment and deposition processes can occur simultaneously or in sequence.

In addition, not every proximity head in the process chamber needs to be used for processing. For example, if pre-treatment is not needed for some types of substrates, the pre-treatment proximity head can move across the substrate with ALD1 proximity head, ALD2 proximity head, and post-treatment proximity head, but no treatment gas is dispensed from the pre-treatment proximity head.

Figure 6B:
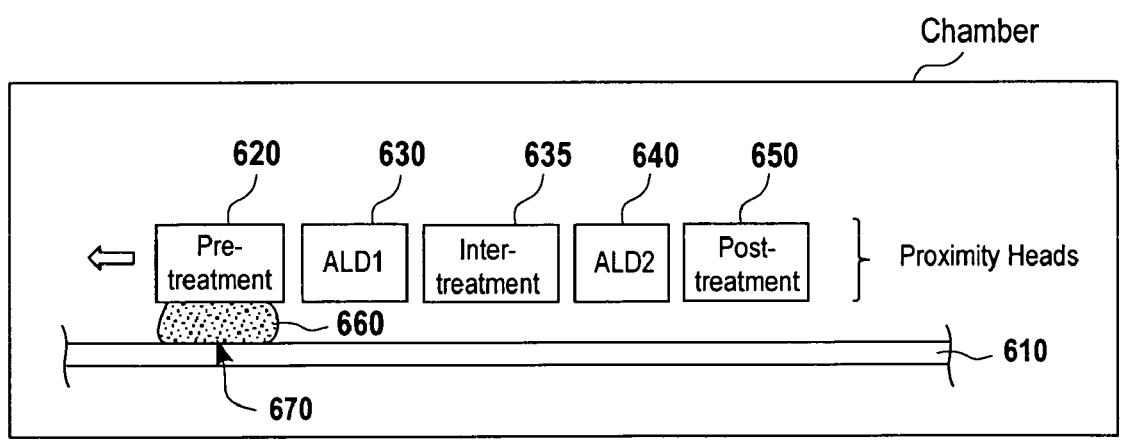
FIG. 6B shows plurality of proximity heads for surface treatment and deposition over a substrate, in accordance with another embodiment of the current invention.

The embodiment shown in FIG. 6A is only an example of integrating treatment proximity head with deposition proximity head. Other combinations are possible. For example, there could be a surface treatment after the barrier layer is deposited and before the deposition of the liner layer. FIG. 6B shows an embodiment with a surface treatment between two deposition steps. Inter-treatment proximity head 635 is inserted between ALD1 proximity head 630 and ALD2 proximity head 640.

The proximity head surface treatment chamber can be integrated with ALD proximity heads to complete surface treatment and barrier/liner layer(s) deposition in one process chamber. Details of integrating proximity heads for ALD with proximity heads for surface treatment are described in commonly assigned U.S. patent application Ser. No. 11/736,519, entitled "Apparatus and Method for Integrated Surface Treatment and Film Deposition," which is filed on the same day as the instant application. The application is incorporated herein by reference in its entirety.

The gap distance between the proximity head and the substrate for surface treatment is small and is between about 5 mm to about 10 mm. The gap distance between the proximity head and the substrate during ALD changes from side to side and is less than about 5 mm, such as 1 mm. The gap distance between the different proximity head and substrate surface can be different for different proximity heads in the chamber.

Once the substrate completes processing in the integrated surface treatment and deposition system, such as the ones in FIGS. 6A and 6B, the substrate is ready for electroless deposition (ELD) of copper seed layer. The substrate should not be exposed to oxygen or other contaminants to ensure the surface is ready for depositing high-quality electroless copper seed layer. To achieve controlled and limited exposure to oxygen or to protect the surface from contaminants, the substrate should be transferred or processed in controlled environment, such as an environment under vacuum or an environment filled with an inert gas.

Figure 7A:
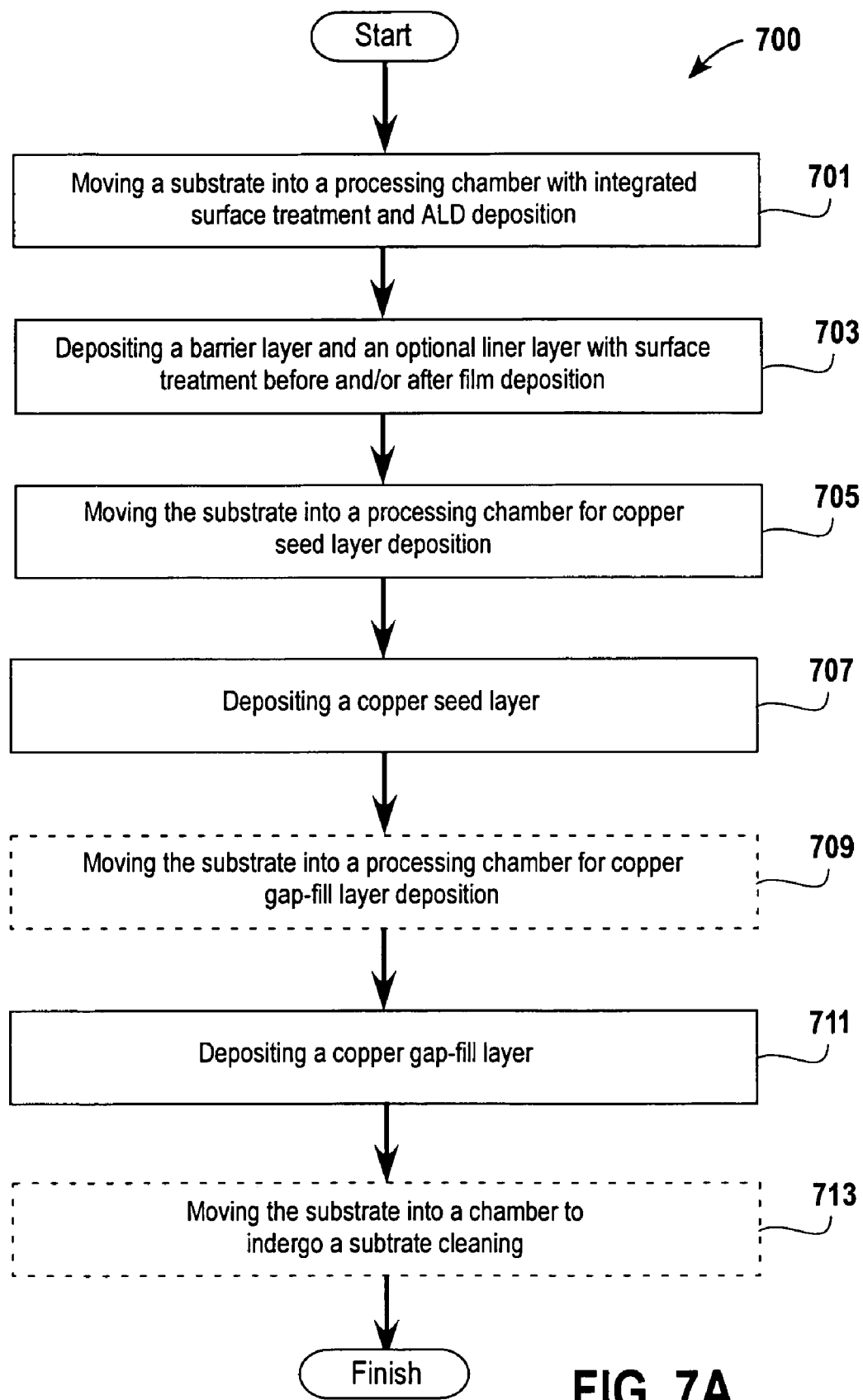
FIG. 7A shows a process flow for surface treatment and film deposition for copper interconnect, in accordance with one embodiment of the current invention.

FIG. 7A shows an embodiment of a process flow 700 of depositing a barrier layer, an optional liner layer, an electroless copper seed layer, and a copper gap-fill layer to fill an interconnect structure. The barrier layer and the optional liner layer are deposited in an integrated chamber that has the process capability of surface treatment. At step 701, the substrate is moved into a process chamber with integrated surface treatment and ALD deposition. As described above, the integrated surface treatment and ALD deposition chamber uses proximity heads for surface treatment and ALD deposition, since proximity heads allow integration of multiple processing heads in one processing chamber.

At step 703, the substrate surface is processed in the process chamber with integrated surface treatment and ALD deposition to deposit a barrier layer and an optional liner layer with surface treatment before and/or after film deposition. In one embodiment, the substrate surface before film deposition, such as the one shown in FIG. 1A, is pre-treated to prepare the surface for barrier layer deposition. The surface is either cleaned to remove surface contaminants or treated with a treatment gas to increase deposition grown sites, as described above. In one embodiment, substrate surface of the interconnect feature, such as surface 122a of FIG. 1A, could have been oxidized to have formed a metal oxide. The metal oxide can be removed by an Ar sputtering process, a plasma process using a fluorine-containing gas, such as $NF_3$, $CF_4$, or a combination of both. Alternatively, the dielectric surfaces of openings 114, 116 might need to be plasma treated to increase deposition sites to improve film quality, as described above. For some barrier layer, such as TaN, a liner layer, such as Ru, might be needed before copper deposition. For other barrier layer, such as Ru, the liner layer might not be needed. In one embodiment, the barrier layer is TaN and the thickness of the barrier layer is between about 20 Å to about 200 Å. The liner layer is Ru and the thickness of the liner layer is between about 20 Å to about 200 Å.

After the barrier layer and the optional liner layer are deposited, the substrate can be post-treated, as described above, to remove surface contaminants or to prepare the substrate surface copper seed layer deposition. Therefore, the integrated chamber can include a proximity head for post-treatment. In one embodiment, the barrier layer is hydrogen-plasma treated to produce a metal-rich surface on the Ta, TaN, or Ru layer to provide a catalytic surface for the subsequent copper seed deposition step.

At step 705, the substrate is moved into a copper seed layer deposition chamber. At step 707, a copper seed layer is deposited. In one embodiment, the thickness of the copper seed layer is between about 25 Å to about 200 Å. In another embodiment, the thickness of the copper seed layer is between about 50 Å to about 100 Å. In one embodiment, the copper seed layer is deposited by an electroless process. The thick copper bulk fill process can be deposited by an electroless deposition (ELD) process or by an electrochemical plating (ECP) process. At step 709, the substrate is moved to a copper-plating chamber. However, if the copper gap-fill layer is deposited by ELD, this step can be skipped (optional step), since the gap-fill layer deposition will be done in the same processing chamber as the seed layer. At step 711, a copper gap fill layer is deposited.

Electroless copper deposition and ECP are well-known wet process. For a wet process to be integrated in a system with controlled processing and transporting environment, the reactor needs to be integrated with a rinse/dryer to enable dry-in/dry-out process capability. In addition, the system needs to be filled with inert gas to ensure minimal exposure of the substrate to oxygen. Recently, a dry-in/dry-out electroless copper process has been developed. Further, all fluids used in the process are de-gassed, i.e. dissolved oxygen is removed by commercially available degassing systems. Details of apparatus and methods of integrating wet and dry processes are described in commonly assigned U.S. patent application Ser. No. 11/514,038, entitled "Processes and Systems for Engineering a Barrier Surface for Copper Deposition" filed on Aug. 30, 2006, which is incorporated herein by reference in its entirety.

The electroless deposition process can be carried out in a number of ways, such as puddle-plating, where fluid is dispensed onto a substrate and is allowed to react in a static mode, after which the reactants are removed and discarded, or reclaimed. In another embodiment, the process uses a proximity process head to limit the electroless process liquid is only in contact with the substrate surface on a limited region. The substrate surface not under the proximity process head is dry. Details of such process and system can be found in U.S. application Ser. No. 10/607, 611, titled "Apparatus And Method For Depositing And Planarizing Thin Films Of Semiconductor Wafers," filed on Jun. 27, 2003, and U.S. application Ser. No. 10/879,263, titled "Method and Apparatus For Plating Semiconductor Wafers," filed on Jun. 28, 2004, both of which are incorporated herein in their entireties.

After copper deposition at steps 707 and 711, the substrate can be optionally moved into a substrate cleaning chamber to undergo an optional substrate cleaning at step 713. Post-copper-deposition clean can be accomplished by using a brush scrub clean with a chemical solution, such as a solution containing CP72B supplied by Air Products and Chemical, Inc. of Allentown, Pa. Other substrate surface cleaning processes can also be used.

Figure 7B:
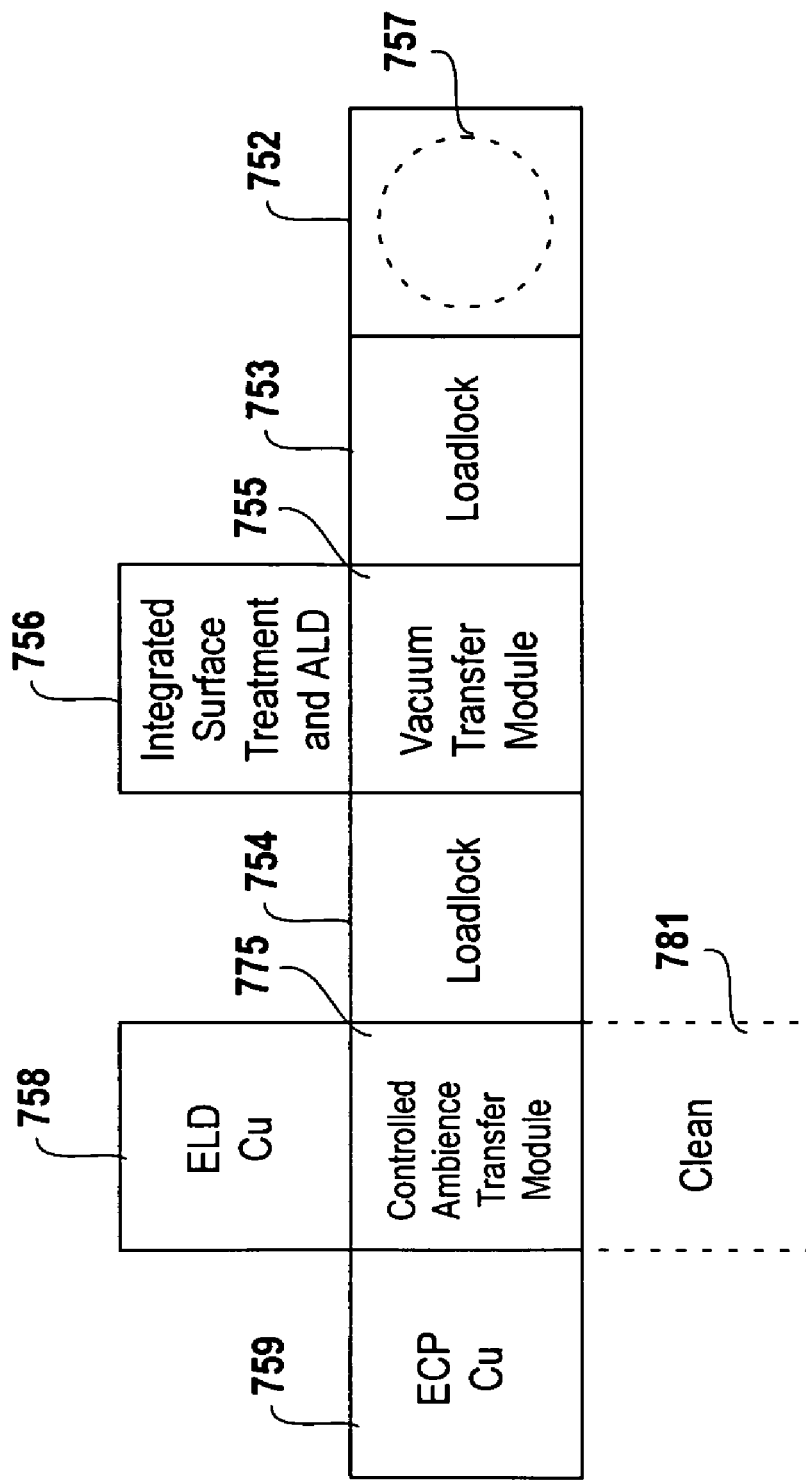
FIG. 7B shows an integrated system for surface treatment and film deposition for copper interconnect, in accordance with one embodiment of the current invention.

FIG. 7B shows an embodiment of a schematic diagram of an integrated system 750 that allows minimal exposure of substrate surface to oxygen or other contaminants after barrier surface preparation. In addition, since it is an integrated system, the substrate is transferred from one process station immediately to the next process station, limiting the duration that the clean or treated barrier layer or liner layer surface is exposed to oxygen. The integrated system 750 can be used to process substrate(s) through the process sequence of flow 700 of FIG. 7A.

As described above, the pre-treatment and post-treatment for barrier/liner layer deposition, ALD of barrier and liner layers, and electroless deposition of copper seed layer, copper gap-fill layer deposition, and the optional post copper gap-fill deposition involve a mixture of dry and wet processes. The wet processes are typically operated near atmosphere, while the dry plasma processes are operated at less than 1 Torr. Therefore, the integrated system needs to be able to handle a mixture of dry and wet processes.

The integrated system 750 has 2 substrate transfer modules 755, and 757. Transfer modules 755 and 757 are equipped with robots to move substrate 751 from one process area to another process area. The process area could be a substrate cassette, a reactor, or a loadlock. Substrate transfer module 755 is operated under vacuum, at a pressure less than about 1 Torr. Substrate transfer module 755 is coupled to a process chamber 756 for integrated surface treatment and ALD, which is also operated under vacuum, at a pressure less than 1 Torr. In one embodiment, vacuum transfer module 755 interfaces with a substrate loader (or substrate cassette) 752 to bring the substrate 751 into the integrated system or to return the substrate to the cassette 752. Between the vacuum transfer module 755 and the cassette 752, there is a loadlock 753 to assist transferring the substrate between the atmospheric cassette 752 and the vacuum transfer module 755, which is operated under vacuum at a pressure compatible with processing chamber(s), such as processing chamber 756, attached. For example, if the substrate 751 is to be transferred from the atmospheric cassette 752 to the vacuum transfer module 755, the pressure of the loadlock 753 is first being brought to be atmospheric to allow the substrate 751 to be transferred from the atmospheric cassette 752 to the loadlock 753. After the substrate 751 is in the loadlock 753 and the loadlock door(s) is closed, the loadlock 753 is pumped to be in vacuum to allow the substrate 751 to be transferred from the loadlock 753 to the vacuum transfer module 755.

As described above in process flow 700, the substrate 751 is brought to the integrated system 750 to deposit barrier/liner layer(s) and copper seed layer, and a copper gap-fill layer. As described in step 701 of process flow 700, substrate 751 is moved to process module 756 with a chamber 756 for integrated surface treatment and ALD barrier/liner deposition. The surface treatment and ALD barrier/liner deposition are performed with proximity heads, such as the ones in FIG. 6A. The surface treatment processes, ALD barrier deposition, and ALD liner deposition described in FIG. 6A are all dry processes and are all operated below 1 Torr.

After substrate 751 is processed in process chamber 756 at step 702, the substrate is ready for ELD copper seed layer deposition. Electroless copper deposition and electro-chemical plating (ECP) are well-known wet processes. As discussed above, for a wet process to be integrated in a system with controlled processing and transporting environment, which has been described above, the reactor needs to be integrated with a rinse/dryer to enable dry-in/dry-out process capability. In addition, the system needs to be filled with inert gas to ensure minimal exposure of the substrate to oxygen. Recently, a dry-in/dry-out electroless copper process has been developed. Further, all fluids used in the process are de-gassed, i.e. dissolved oxygen is removed by commercially available degassing systems.

Both ELD copper and ECP copper processing modules need to be integrated with a transfer module with controlled ambient; therefore, the substrate transport module 757 is operating under controlled-ambient to limit the exposure of substrate to oxygen or contaminants. In one embodiment, the substrate transport module 757 is filled with an inert gas and operated at atmospheric pressure. Substrate 751 is moved from processing chamber 756 to ELD copper processing module 758 for copper seed layer deposition, as described in steps 705 and 707. Afterwards, the substrate 751 is moved to ECP copper module 759 for copper gap-fill deposition, as described in step 709 and 711. After ECP gap-fill, the substrate 751 could be moved into a cleaning module 761 and undergoes a substrate cleaning, as described in step 713. However, the cleaning after ECP copper deposition is optional. The ECP processing module has an integrated rinse/dry, which might have sufficiently cleaned the substrate.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention. In the claims, elements and/or steps do not imply any particular order of operation, unless explicitly stated in the claims.

What is claimed is:

1. A method of depositing films on a substrate for copper interconnect in an integrated system, comprising:
    moving the substrate into a processing chamber having a plurality of proximity heads, selected ones of the proximity heads being configured to perform at least one of surface treatments and atomic layer depositions (ALDs), the processing chamber being part of the integrated system, and within the processing chamber, performing,
        barrier layer deposition over a surface of the substrate using one of the plurality of proximity heads functioning to perform barrier layer ALD; and
    moving the substrate from the processing chamber, through a transfer module of the integrated systems, into a processing module for performing copper seed layer deposition, the processing module for performing copper seed layer deposition being part of the integrated system, wherein the processing module for performing copper seed layer deposition is integrated with a rinse/dryer to enable dry-in/dry-out process capability limiting the exposure of the substrate to oxygen, and within the processing module for performing copper seed layer deposition, performing,
        copper seed layer deposition over the surface of the substrate,
    wherein the integrated system enables controlled-ambient transitions within the integrated system to limit exposure of the substrate to uncontrolled ambient conditions outside of the integrated system.

2. The method of claim 1, further comprising:
    moving the substrate from the processing module for performing copper seed layer deposition, through the transfer module of the integrated system, into a processing module for performing copper gap-fill layer deposition, the processing module for performing copper gap-fill layer deposition being part of the integrated, system, and within the processing module for performing copper gap-fill layer deposition, performing,
        copper gap-fill layer deposition over the copper seed layer of the substrate; and
    moving the substrate from the processing module for performing copper gap-fill layer deposition, through the transfer module of the integrated system and into a processing module for performing substrate cleaning, the processing module for performing substrate cleaning being part of the integrated system, and within the processing module for substrate cleaning, performing,
        cleaning of the substrate after the copper gap-fill layer deposition has been performed.

3. The method of claim 2, wherein the processing module for performing copper gap-fill layer deposition is an electro-chemical plating (ECP) module.

4. The method of claim 1, further comprising:
    performing surface pre-treatment over the surface of the substrate using one of the plurality of proximity heads functioning to perform surface pre-treatment in the processing chamber before the barrier layer deposition.

5. The method of claim 4, wherein the surface pre-treatment is performed over the surface of the substrate to remove contaminants or to activate the surface of the substrate for the barrier layer deposition.

6. The method of claim 4, further comprising:
    performing liner layer deposition over the barrier layer of the substrate using one of the plurality of proximity heads functioning to perform liner layer ALD in the processing chamber, and
    performing surface post-treatment over the surface of the substrate using one of the plurality of proximity heads functioning to perform surface post-treatment in the processing chamber after the liner layer deposition.

7. The method of claim 6, wherein the surface post-treatment is performed over the surface of the substrate to remove contaminants or to activate the surface of the substrate in preparation for the copper seed layer deposition.

8. The method of claim 6, wherein substrate processing on substrate is performed in the sequence of surface pre-treatment, barrier layer deposition, liner layer deposition, and surface post-treatment.

9. The method of claim 6, the metals in the barrier layer and the liner layer are selected from the group consisting of tantalum (Ta), titanium (Ti), tungsten (W), zirconium (Zr), hafnium (HD, molybdenum (Mo), niobium (Nb), vanadium (V), ruthenium (Ru) and chromium (Cr).

10. The method of claim 1, wherein the processing module for performing copper seed layer deposition is an electroless deposition (ELD) module.

11. The method of claim 1, wherein the transfer module and the processing module for performing copper seed layer deposition are filled with an inert gas to limit the exposure of the substrate to oxygen.

12. The method of claim 1, wherein the films deposited on the substrate for copper interconnect in the integrated system with limited exposure to uncontrolled ambient conditions outside the integrated system improve electro-migration (EM) performance for copper interconnect.

13. The method of claim 1, wherein the barrier layer deposited is conformal and reduces void formation in copper interconnect.

14. A method of depositing films on a substrate for copper interconnect in an integrated system, comprising:
    moving the substrate into a processing chamber having a plurality of proximity heads, selected ones of the proximity heads being configured to perform at least one of surface treatments and atomic layer depositions (ALDs), the processing chamber being part of the integrated system, and within the processing chamber, performing,
        surface pre-treatment over a surface of the substrate using one of the plurality of proximity heads functioning to perform surface pre-treatment in the processing chamber before a barrier layer deposition, wherein the surface pre-treatment is performed over the surface of the substrate to remove contaminants or to activate the surface of the substrate for the barrier layer deposition, and barrier layer deposition over the surface of the substrate using one of the plurality of proximity beads functioning to perform barrier layer ALD after surface pre-treatment; and moving the substrate from the processing chamber, through a transfer module of the integrated system, into a processing module for performing copper seed layer deposition, the processing module for performing copper seed layer deposition being part of the integrated system, wherein the processing module for performing copper seed layer deposition is integrated with a rinse/dryer to enable dry-in/dry-out process capability limiting the exposure of the substrate to oxygen, and within the processing module for performing copper seed layer deposition, performing, copper seed layer deposition over the surface of the substrate, wherein the integrated system enables controlled-ambient transitions within the integrated system to limit exposure of the substrate to uncontrolled ambient conditions outside of the integrated system.

15. The method of claim 14, further comprising:

moving the substrate from the processing module for performing copper seed layer deposition, through the transfer module of the integrated system and into a processing module for performing copper gap-fill layer deposition, the processing module for performing copper gap-fill layer deposition being part of the integrated system, and within the processing module for performing copper gap-fill layer deposition, performing, copper gap-fill layer deposition over the copper seed layer of the substrate; and moving the substrate from the processing module for performing copper gap-fill layer deposition, through the transfer module of the integrated system, into a processing module for performing substrate cleaning, the processing module for performing substrate cleaning being part of the integrated system, and within the processing module for substrate cleaning, performing, cleaning of the substrate after the copper gap-fill layer deposition has been performed.

16. The method of claim 14, further comprising:

performing liner layer deposition over the barrier layer of the substrate using one of the plurality of proximity heads functioning to perform liner layer ALD in the processing chamber, and performing surface post-treatment over the surface of the substrate using one of the plurality of proximity heads functioning to perform surface post-treatment in the processing chamber after the liner layer deposition, wherein the surface post-treatment is performed over the surface of the substrate to remove contaminants or to activate the surface of the substrate in preparation for the copper seed layer deposition.

17. The method of claim 16, wherein substrate processing on substrate is performed in the sequence of surface pre-treatment, barrier layer deposition, liner layer deposition, and surface post-treatment.

18. The method of claim 14, wherein the transfer module and the processing module for performing copper seed layer deposition are filled with an inert gas to limit the exposure of the substrate to oxygen.

19. A method of depositing films on a substrate for copper interconnect in an integrated system, comprising:

moving the substrate into a processing chamber having a plurality of proximity heads, selected ones of the proximity heads being configured to perform at least one of surface treatments and atomic layer depositions (ALDs), the processing chamber being part of the integrated system, and within the processing chamber, performing, barrier layer deposition over a surface of the substrate using one of the plurality of proximity heads functioning to perform barrier layer ALD, surface pre-treatment over the surface of the substrate using one of the plurality of proximity heads functioning to perform surface pre-treatment in the processing chamber before the barrier layer deposition, liner layer deposition over the barrier layer of the substrate using one of the plurality of proximity heads functioning to perform liner layer ALD in the processing chamber, and surface post-treatment over the surface of the substrate using one of the plurality of proximity heads functioning to perform surface post-treatment in the processing chamber after the liner layer deposition; and moving the substrate from the processing chamber, through a transfer module of the integrated system, into a processing module for performing copper seed layer deposition, the processing module for performing copper seed layer deposition being part of the integrated system, and within the processing module for performing copper seed layer deposition, performing, copper seed layer deposition over the surface of the substrate, wherein the integrated system enables controlled-ambient transitions within the integrated system to limit exposure of the substrate to uncontrolled ambient conditions outside of the integrated system.

20. The method of claim 19, wherein the surface post-treatment is performed over the surface of the substrate to remove contaminants or to activate the surface of the substrate in preparation for the copper seed layer deposition.

21. The method of claim 19, wherein substrate processing on substrate is performed in the sequence of surface pre-treatment, barrier layer deposition, liner layer deposition, and surface post-treatment.

22. The method of claim 19, the metals in the barrier layer and the liner layer are selected from the group consisting of tantalum (Ta), titanium (Ti), tungsten (W), zirconium (Zr), hafnium (Hf), molybdenum (Mo), niobium (Nb), vanadium (V), ruthenium (Ru) and chromium (Cr).

* * * * *